United States Patent
Chung et al.

(10) Patent No.: US 7,459,956 B2
(45) Date of Patent: Dec. 2, 2008

(54) STORING INFORMATION WITH ELECTRICAL FUSE FOR DEVICE TRIMMING

(75) Inventors: Shine Chien Chung, Sanchung (TW); Yun-Sheng Chen, Baoshan Shiang (TW)

(73) Assignee: Taiwan Semiconductor Manufacturing Co., Ltd., Taiwan (CN)

( * ) Notice: Subject to any disclaimer, the term of this patent is extended or adjusted under 35 U.S.C. 154(b) by 524 days.

(21) Appl. No.: 11/055,816

(22) Filed: Feb. 10, 2005

(65) Prior Publication Data
US 2005/0247996 A1    Nov. 10, 2005

Related U.S. Application Data

(60) Provisional application No. 60/568,189, filed on May 5, 2004.

(51) Int. Cl.
*H01H 37/76*  (2006.01)
(52) U.S. Cl. .................................. 327/525
(58) Field of Classification Search .......... 327/308, 327/525
See application file for complete search history.

(56) References Cited

U.S. PATENT DOCUMENTS

| | | | | |
|---|---|---|---|---|
| 4,608,530 A | * | 8/1986 | Bacrania | 323/315 |
| 4,686,384 A | * | 8/1987 | Harvey et al. | 327/530 |
| 5,361,001 A | * | 11/1994 | Stolfa | 327/530 |
| 5,815,025 A | * | 9/1998 | Kubota | 327/514 |
| 6,140,862 A | * | 10/2000 | Hagura | 327/537 |
| 6,384,664 B1 | * | 5/2002 | Hellums et al. | 327/525 |
| 6,462,609 B2 | * | 10/2002 | Hashimoto et al. | 327/525 |
| 6,670,843 B1 | * | 12/2003 | Moench et al. | 327/525 |
| 6,703,885 B1 | * | 3/2004 | Fan et al. | 327/308 |
| 6,774,702 B2 | * | 8/2004 | Kimura | 327/525 |
| 6,919,754 B2 | * | 7/2005 | Kuroki | 327/525 |
| 7,119,603 B2 | * | 10/2006 | Newman | 327/525 |
| 7,271,644 B2 | * | 9/2007 | Lin et al. | 327/525 |

* cited by examiner

*Primary Examiner*—Jeffrey S Zweizig
(74) *Attorney, Agent, or Firm*—Duane Morris LLP

(57) ABSTRACT

A method and system is disclosed for device trimming. A device trimming system comprises at least one reference device to be trimmed having a reference electrical parameter, at least one trimming device to be coupled with the reference device for forming a trimmed reference device providing an altered reference electrical parameter based on a combination of the reference device and the trimming device, and at least one electrical fuse based control module for controlling whether the trimming device is to be coupled with the reference device based on a state of the electrical fuse.

19 Claims, 9 Drawing Sheets

STORING INFORMATION WITH ELECTRICAL FUSE FOR DEVICE TRIMMING

CROSS REFERENCE

This application claims the benefits of U.S. Patent Application Ser. No. 60/568,189, which was filed on May 5, 2004 and entitled "Electrical Fuse to Store Information for Trimming."

BACKGROUND

The present invention relates generally to integrated circuit designs, and more particularly to methods of storing data with electrical fuses for device mismatch and process variation trimming.

Device mismatch or process variation trimming is typically helpful in designing analog circuitry or logic circuitry with analog nature, such as sense amplifiers. The conventional approaches are either trimming on demand without keeping the trimming data or storing the trimmed data in non-volatile devices such as flash memory, Electrically Erasable Programmable Read Only Memory (EEPROM), or Erasable Programmable Read Only Memory (EPROM).

If trimming data are not saved and are generated on demand, it can consume large amount of time and power. Data can be saved in non-volatile devices such as flash memory or EEPROM, but they are not compatible with standard logic process. Such incompatibility results in a higher cost. Laser trimming, which is a computer-controlled material-removing technique by vaporization that is commonly used for trimming resistors, is another trimming method that is often used in analog-to-digital (A/D) or digital-to-analog (D/A) converters. Even though this method can provide precise narrow cuts and break specific laser fuses that can be used for storing information such as trimming data, the process can be rather expensive.

It is always desirable to have a simple and cost efficient solution to store trimming data to improve system accuracy.

SUMMARY

In view of the foregoing, this invention provides circuits and methods for electrical device trimming and storing trimming data for dealing with device mismatch and process variation. With the following embodiments, electrical fuses can be used as a lower-cost alternative for nonvolatile data storage.

The construction and method of operation of the invention, however, together with additional objects and advantages thereof will be best understood from the following descriptions of specific embodiments when read in connection with the accompanying figures.

DESCRIPTION

The present invention provides circuits and methods for electrical device trimming and storing the trimming data for dealing with device mismatch and process variation.

Electrical fuses are often utilized for modern semiconductors for making adjustments and repairs that are preformed as late as in the packaged chip. They are designed to blow when a current through the fuses exceeds a threshold, thereby causing energy build-up and blowing the fuses. By blowing the fuse during programming, electrical fuses can provide nonvolatile data storage. The implementation of electrical fuses can provide more design flexibility such as positioning the fuse within the chip. Since wirings are allowed in layers above and below the fuses, electrical fuses are a desirable component for higher density memory devices. If the number of bits for the data that need to be stored becomes larger (for example, over 32 bits), electrical fuses can be grouped into fuse blocks such that all data may be stored, and the data may be later downloaded into latches for trimming control by a finite state machine.

Figure 1A:
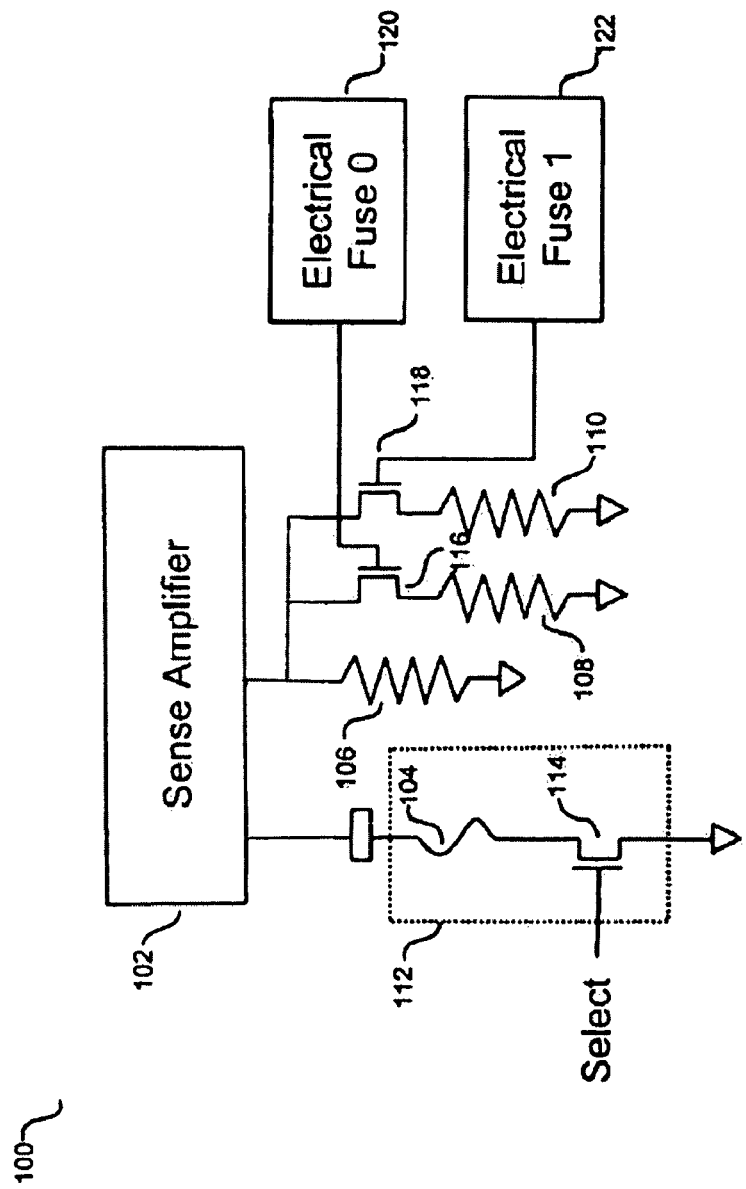
FIG. 1A illustrates a circuit with a resistance trimming feature in accordance with the first embodiment of the present invention.

FIG. 1A illustrates a circuit 100 with a resistance trimming feature that is necessary for obtaining the desirable resistance from a reference resistor used for a sense amplifier 102 in accordance with the first embodiment of the present invention. The sense amplifier 102 is used for making comparisons of resistance values of an electrical fuse 104 and the reference resistance, which is made of resistors 106, 108, and 110. The sense amplifier 102 has two terminals: one connected to a fuse cell 112 which consists of the electrical fuse 104 and a programming device 114, and another terminal connected to the group of resistors 106, 108, and 110, wherein the resistor 106 is referred to as the reference resistor and the resistors 108 and 110 are referred to as trimming resistors.

While the reference resistor 106 is permanently providing a reference resistance for the sense amplifier 102, the reference resistance for the sense amplifier 102 may be adjusted or trimmed, depending upon the position of switches 116 and 118. If one of the switches is turned on, the reference resistor is altered by the trimming resistor to collectively form a trimmed reference resistor. For example, if the switch 116 is turned on, the resistor 108 will be in parallel with the resistor 106, thereby providing a trimmed reference resistance. The switches 116 and 118 are controlled by the states of electrical fuses 120 and 122. To adjust the reference resistance to the desirable trimmed reference resistance for the sense amplifier 102, the electrical fuses 120 and 122 can be programmed to break, thereby changing the state, respectively, of the switches 116 and 118.

With the correct trimmed reference resistance, the sense amplifier 102 can provide the desired logic signal output after comparing the resistive value of the electrical fuse 104 against the trimmed reference resistance.

In fact, the device trimming feature that is presented in FIG. 1A can be extended to trim other electrical devices such as capacitors, inductors, or even transistors. In these variations, there is always a reference device that has a reference electrical parameter that can be altered by adding additional trimming devices. The trimming devices are only put in use when an electrical fuse based control module enables them. The altered or trimmed electrical parameter is used as a reference to be compared with a selected device (e.g., the fuse 104) by a comparison module (e.g., the sense amplifier 102).

Figure 1B:
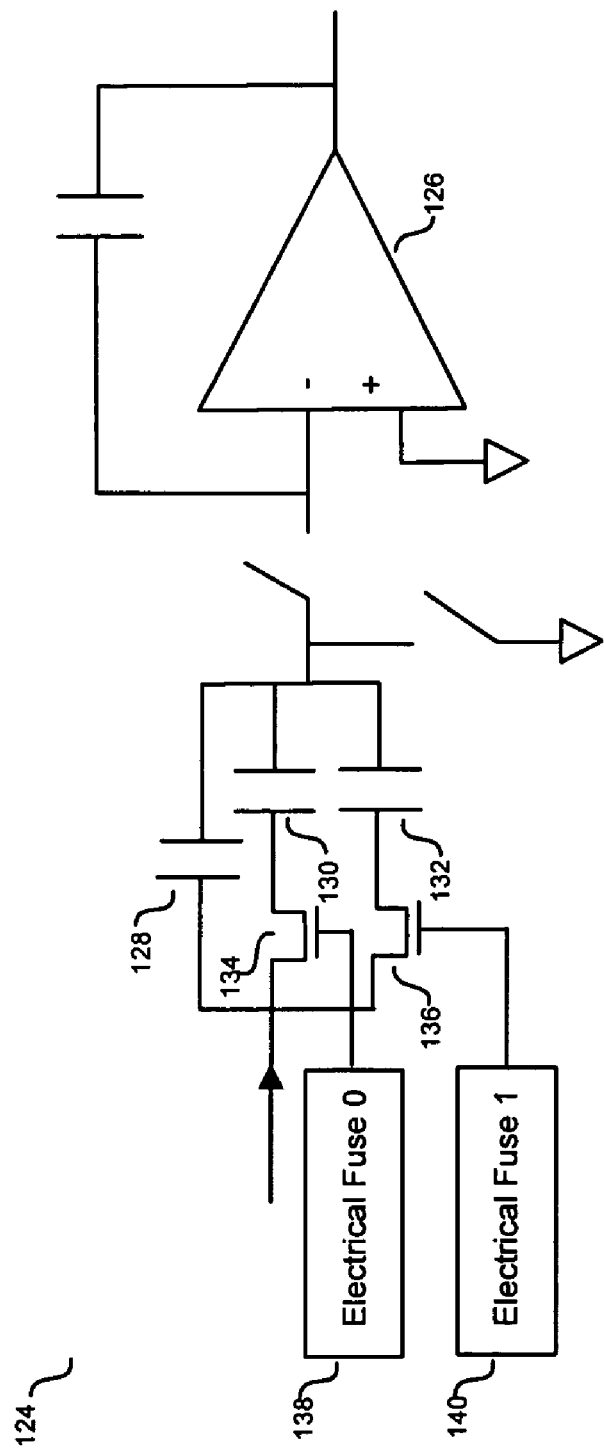
FIG. 1B illustrates a circuit with a capacitance trimming feature in accordance with the second embodiment of the present invention.

FIG. 1B illustrates a circuit 124 with a capacitance trimming feature that is used for obtaining the desirable capacitance for devices such as an A/D converter 126 in accordance with the second embodiment of the present invention. Analog circuits, such as the A/D converter 126, require device matching capabilities, one such as capacitance trimming, in order to get better circuit performance. For a typical A/D converter without any trimming, the device can hardly achieve over 8 bits of resolution out of a possible 16 bits resolution. By implementing capacitance trimming, the accuracy of the device can be improved to 10 to 14 bits, and with proper calibration, 16-bit accuracy may be achievable.

Capacitors 128, 130, and 132 are placed in a parallel fashion. The capacitors 130 and 132 can be controlled by switches 134 and 136. By turning on one of the switches, the corresponding capacitor may be connected in parallel with the capacitor 128 to affect the capacitance entering the A/D converter 126. For example, by turning on the switch 134, the capacitor 130, which is attached to the switch 134, can be connected in parallel with the capacitor 128 to affect the capacitance entering the A/D converter 126. The switches 134 and 136 can be respectively controlled by programming electrical fuses 138 and 140.

By programming the proper fuse to get the necessary capacitance for capacitance trimming, a higher accuracy for the A/D converter 126 may be achieved.

Figure 1C:
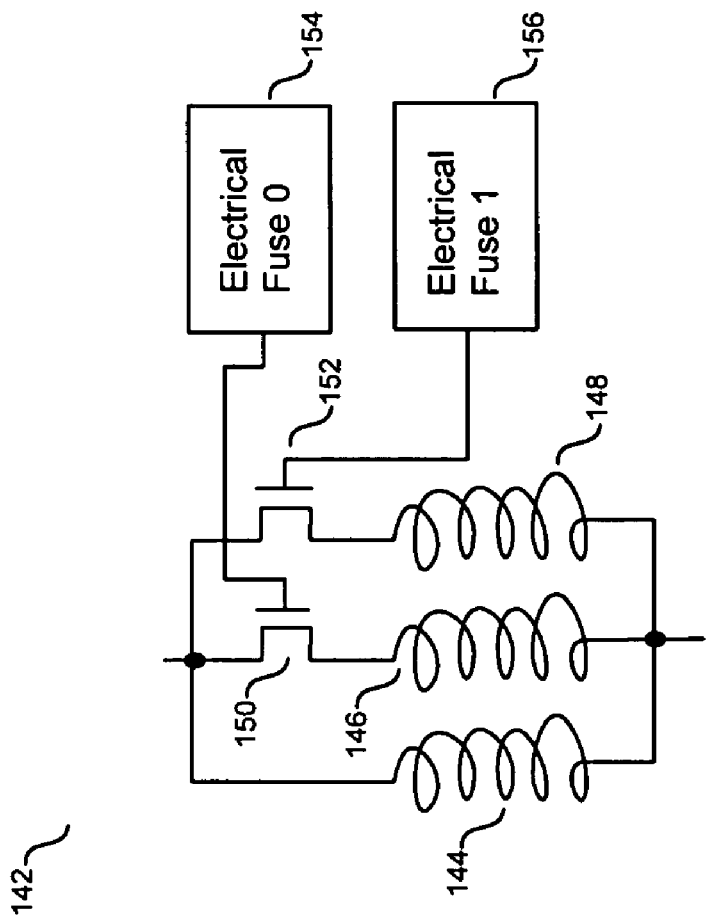
FIG. 1C illustrates a circuit with an inductance trimming feature in accordance with the third embodiment of the present invention.

FIG. 1C illustrates a circuit 142 with an inductance trimming feature that is used for obtaining the desirable inductance in accordance with the third embodiment of the present invention. Inductance trimming can be important for RF circuits, since it can improve accuracy and circuit performance.

Inductors 144, 146, and 148 are placed in a parallel fashion. The inductors 146 and 148 are respectively controlled by switches 150 and 152. The total inductance value of the circuit 142 can be adjusted by changing the state of either of the switches 150 or 152, since it can result in connecting or disconnecting, respectively, the inductors 146 or 148. The switches 150 and 152 can be respectively controlled by programming electrical fuses 154 and 156.

Figure 1D:
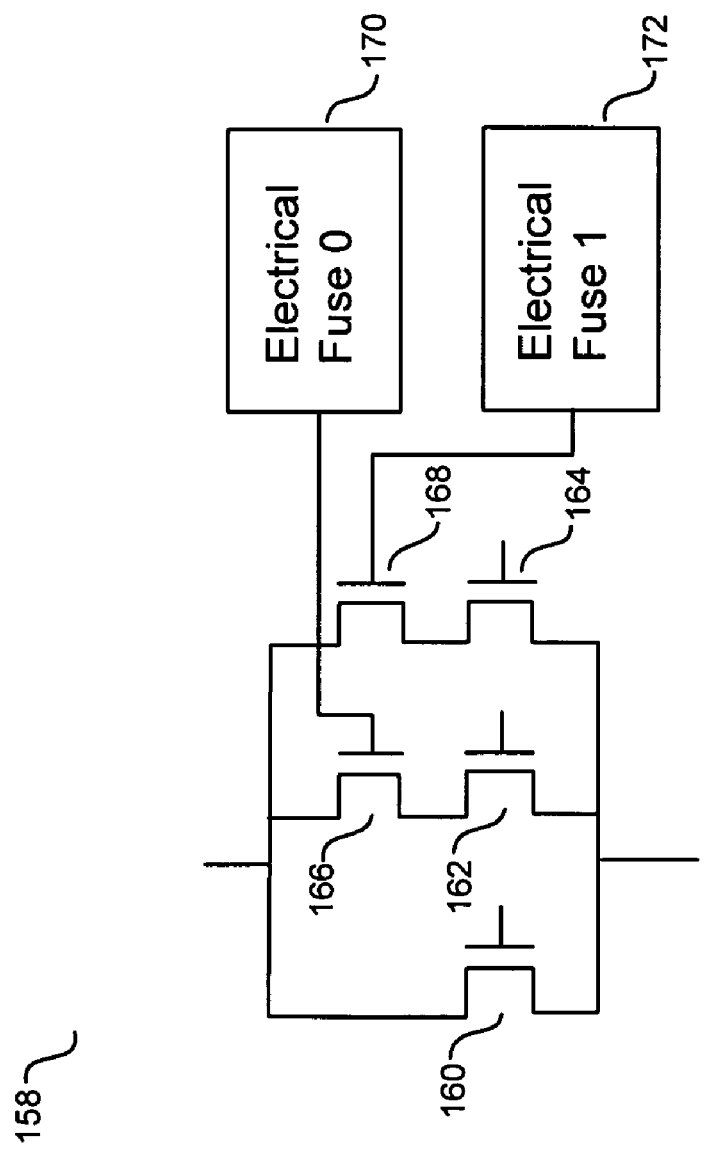
FIG. 1D illustrates a circuit with a transistor trimming feature in accordance with the fourth embodiment of the present invention.

FIG. 1D illustrates a circuit 158 with a transistor trimming feature in accordance with the fourth embodiment of the present invention. NMOS transistors 160, 162, and 164 are placed in a parallel fashion. The NMOS transistor 162 is connected to a switch 166, while the NMOS transistor 164 is connected to a switch 168. The switches 166 and 168 determine if the transistors 162 and 164, respectively, are connected with the transistor 160. If one of the switches is turned on, the transistor will be connected with the transistor 160 in parallel. For example, if the switch 166 is turned on, the transistor 162 will be connected with the transistor 160 in parallel. The switches 166 and 168 can be respectively controlled by programming electrical fuses 170 and 172. By programming the proper electrical fuse to break, the correct transistors may be selected.

Figure 2:
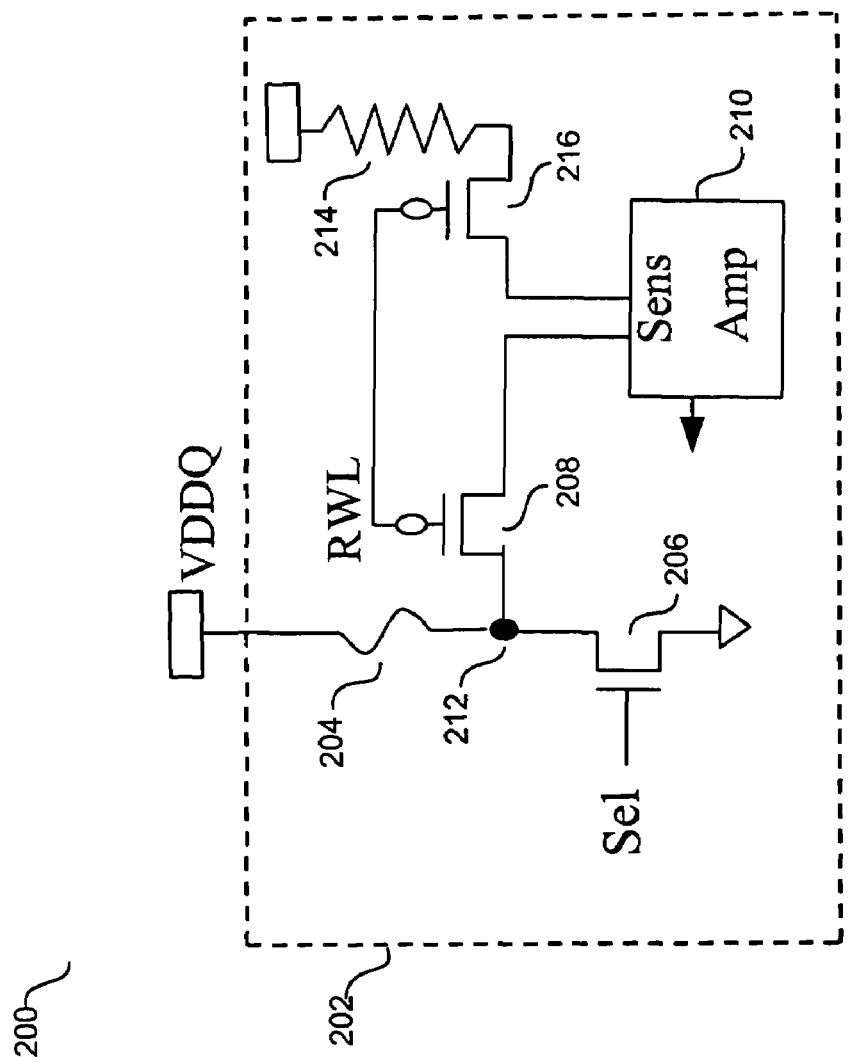
FIG. 2 illustrates a data storing module for storing trimming data in a fuse cell in accordance with the fifth embodiment of the present invention.

FIG. 2 illustrates a data storing module 200 and method for storing trimming data in a fuse cell 202 in accordance with the fifth embodiment of the present invention. The fuse cell 202, which is used for storing trimming data, contains an electrical fuse 204, a thin NMOS programming device 206, a PMOS output select device 208, and a sense amplifier 210. The sense amplifier 210 is designed to compare the resistance of the electrical fuse 204 at a node 212 against the resistance of a reference resistor 214, and to output a response of the logic state "0" or "1". This logic state output can determine if the resistance value of the electrical fuse 204 is within the range of the resistance of the reference resistor 214. With this output information, the necessary level of programming voltage may be determined and applied at VDDQ to insure that the electrical fuse 204 will break during programming process.

If the electrical fuse 204 is to be programmed to store data such as trimming data, read wordline (RWL) must have a high signal during the program process to turn off the output select device 208 in order to keep current away from the sense amplifier 210. The select line "Sel" will provide a high signal to turn on programming device 206, thereby allowing the programming voltage VDDQ to break the electrical fuse 204.

To read the state of the electrical fuse 204, a low signal can enter through a read wordline (RWL), turning on both the output select device 208 and a thin PMOS enable device 216. This allows the sense amplifier 210 to compare resistance values at the node 212 and at the reference resistor 214 through the two terminals. After comparing the two values, the sense amplifier 210 can output a logic state response.

It is noteworthy that the programming device 206, the output select device 208, and the enable device 216 of this embodiment can be PMOS, NMOS, or zero-$V_t$ MOS. The MOS devices used can also be either thick or thin gate-oxide.

Figure 3A:
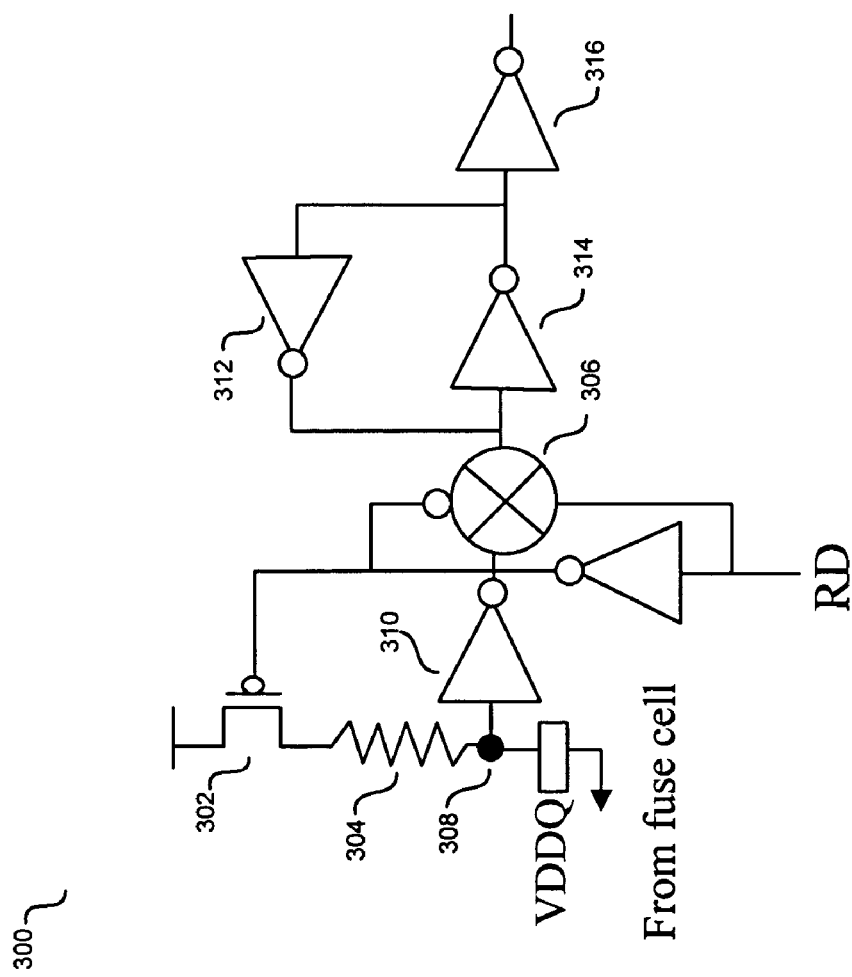
FIG. 3A illustrates a sense amplifier that uses a PMOS device and a reference resistor to construct a voltage divider in accordance with the sixth embodiment of the present invention.

FIG. 3A illustrates a sense amplifier 300 that uses a PMOS device 302 and a reference resistor 304 to construct a voltage divider in accordance with the sixth embodiment of the present invention. The sense amplifier 300 is designed to make a comparison of the electrical fuse resistance against the resistance of the reference resistor 304 to determine a logic state output.

The read process begins by asserting a high signal into a control signal RD. The inverted signal will turn on the PMOS device 302 and close a multiplexer 306. Voltage measured at a node 308 will be determined by the resistances of the reference resistor 304 and the selected fuse from the fuse array, which are connected in a serial fashion. Impedances of the PMOS device 302 and the programming device within the connected fuse cell, not shown, are low and insignificant. With the multiplexer 306 closed due to the control signal RD, the signal at the node 308 will be inverted by an inverter 310 and is allowed to enter a latch made of inverters 312 and 314. The signal at the latch is further inverted by an inverter 316 and outputted as the logic state output of the sense amplifier 300.

Figure 3B:
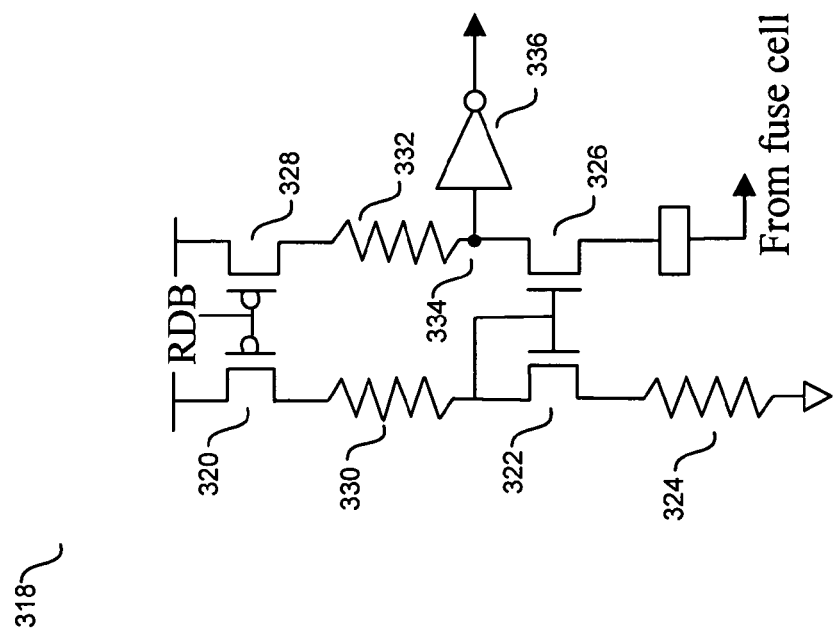
FIG. 3B illustrates a sense amplifier that uses a PMOS device, a NMOS device, and a reference resistor to construct a bias circuit in accordance with the seventh embodiment of the present invention.

FIG. 3B illustrates a sense amplifier 318 that uses a PMOS device 320, a NMOS device 322, and a reference resistor 324 to construct a bias circuit in accordance with the seventh embodiment of the present invention. The source of a NMOS device 326 is connected to a fuse cell which contains the electrical fuse that will be read.

When the sense amplifier 318 is to make a comparison of the resistance of the selected electrical fuse against the resistance of the reference resistor 324 to determine a logic state output for the reading process, a low signal is asserted through a control signal RDB. Both PMOS devices 320 and 328 will be turned on, thereby allowing supply voltage VDD to go through tracking resistors 330 and 332 to turn on the NMOS devices 322 and 326. Since the gate of the NMOS device 322 is connected to the gate of the NMOS device 326, the NMOS device 326 can stay in saturation region. This allows any resistance difference between fuse terminal and the reference resistor 324 to be amplified to an output node 334. The amplified output signal at the node 334 will be inverted, through an inverter 336, and outputted.

It is noteworthy that the tracking resistors 330 and 332 are implemented mainly to help improve tracking, while the PMOS devices 320 and 328 are implemented as pull-up devices to enable/disable the amplifier. It is also noteworthy that two main current paths, one through the NMOS device 322 and another through the NMOS device 326, determine the voltage at the output node 334.

Figure 3C:
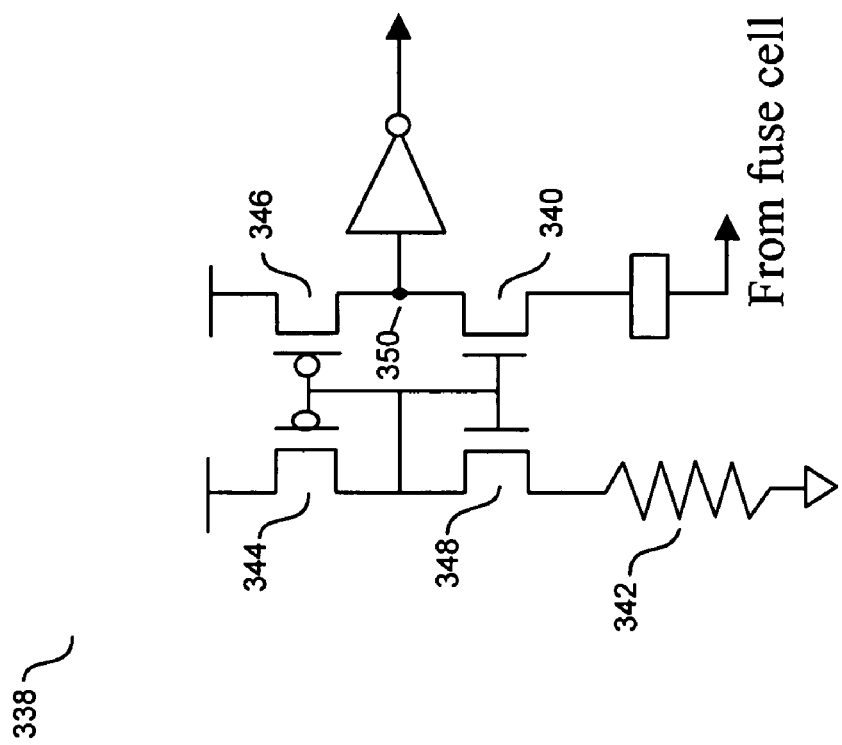
FIG. 3C illustrates a sense amplifier with a PMOS device configured as a diode to bias another PMOS device in accordance with the eighth embodiment of the present invention.

FIG. 3C illustrates a sense amplifier 338 with a PMOS device configured as a diode to bias another PMOS device in accordance with the eighth embodiment of the present invention. The sense amplifier 338 compares resistance of a selected electrical fuse from the fuse cell connected to the source of a NMOS device 340 against the resistance of a reference resistor 342 to determine a logic state output. A PMOS device 344 is configured as a diode to bias a PMOS device 346 such that the PMOS device 346 can operate in saturation with higher output impedance. During a reading process, the PMOS device 344, the PMOS device 346, the NMOS device 340, and a NMOS device 348 will be turned on. The resistance difference between the fuse terminal and the reference resistor 342 will output through a node 350.

Figure 4:
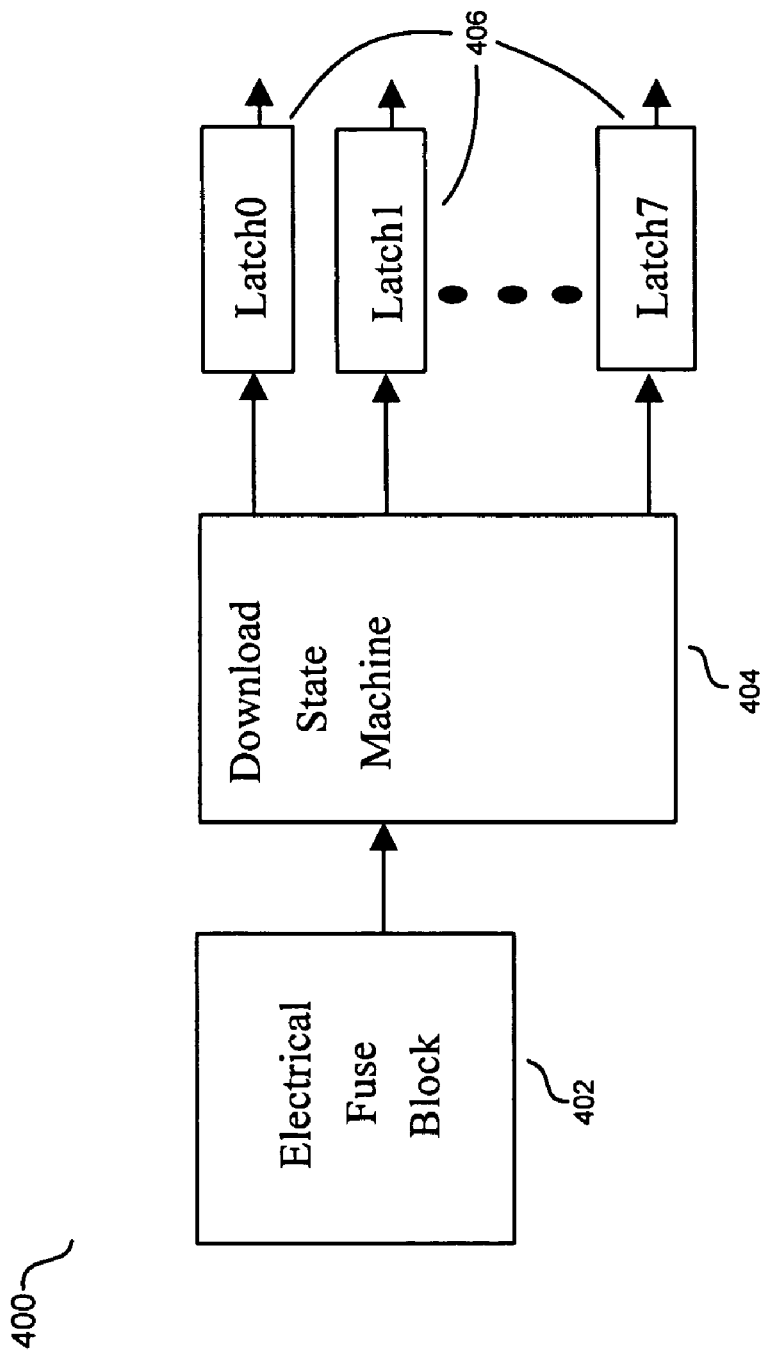
FIG. 4 presents a block diagram illustrating how data from each individual fuse cell may be downloaded into latches upon reset or initialization of the system in accordance with the ninth embodiment of the present invention.

FIG. 4 presents a block diagram 400 illustrating how data from each individual fuse cell may be downloaded into latches upon reset or initialization of the system in accordance with the ninth embodiment of the present invention.

Trimming can be a very cost effective approach for trimming a small number of bits by integrating fuses within the sensing circuits. As the number of cells needed for trimming becomes larger, electrical fuses can be grouped together into blocks, such as a fuse block 402, to make programming much more efficient. This avoids the large IR drop in any VDDQ bus that can make fuses very hard to blow while being programmed. When multiple electrical fuses are grouped into the fuse block 402, sensing circuit is placed outside of the fuse array and the fuse data will be sensed and downloaded into latches for trimming.

The block diagram 400 shows a download state machine 404 reading an 8-bit data from the electrical fuse block 402 and passing the information to eight latches 406. When an initialization signal attempts to reset or assert the circuit, the download state machine 404 first generates suitable addresses to read data stored in the fuse block 402, and then loads them into the eight latches 406.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims.

Accordingly, it is appropriate that the appended claims be construed broadly and in a manner consistent with the scope of the invention, as set forth in the following claims.

What is claimed is:

1. A circuit for device trimming, the circuit comprising:
   at least one reference device to be trimmed having a reference electrical parameter;
   at least one trimming device to be coupled with the reference device for forming a trimmed reference device providing an altered reference electrical parameter based on a combination of the reference device and the trimming device;
   at least one electrical fuse based control module for controlling whether the trimming device is to be coupled with the reference device based on a state of the electrical fuse; and
   a comparison module for comparing an electrical parameter of a selected device against the altered electrical parameter provided by the trimmed reference device,
   wherein the reference device and the trimming device are reference and trimming resistors, wherein the trimmed reference device is the trimmed reference resistor, and wherein the electrical parameter is resistance, and wherein the selected device is an electrical fuse.

2. The circuit of claim 1 wherein the comparison module is a sense amplifier.

3. The circuit of claim 2 wherein the sense amplifier connects the electrical fuse with the trimmed reference resistor in a serial fashion to measure a voltage level at a node between them for providing a sensed output.

4. The circuit of claim 3 wherein the sense amplifier further comprises a control signal for enabling the sense amplifier to perform the comparison.

5. The circuit of claim 2 wherein the sense amplifier arranges the selected electrical fuse and the trimmed reference resistor in a parallel fashion.

6. The circuit of claim 5 wherein the sense amplifier has a first current path and a second current path coupled thereto, the first current path having a first NMOS device coupled between a first PMOS device and trimmed reference resister, and the second current path having a second NMOS device coupled between a second PMOS device and the selected electrical fuse, wherein a drain of the first NMOS device is connected to gates of both NMOS devices and wherein the gates of the PMOS devices are controlled by a control signal.

7. The circuit of claim 6 wherein the sense amplifier further includes a first tracking resistor coupled between the first PMOS device and the first NMOS device and a second tracking resistor coupled between the second PMOS device and the second NMOS device.

8. The circuit of claim 2 wherein the sense amplifier has a first current path and a second current path coupled thereto, the first current path having a first NMOS device coupled between a first PMOS device and the trimmed reference resistor, and the second current path having a second NMOS device coupled between a second PMOS device and the selected electrical fuse, wherein a drain of the first NMOS device is connected to gates of both NMOS devices and wherein the gates of the PMOS devices are connected to gates of the NMOS devices.

9. The circuit of claim 1 further comprising a data storing module for storing a state of a predetermined fuse of the fuse based control module.

10. A method for electrical device trimming using electrical fuses, the method comprising:
   identifying at least one reference device having a reference electrical parameter need to be trimmed;

coupling at least one trimming device with the reference device for providing an altered reference electrical parameter based on an electrical combination of the reference device and the trimming device; and comparing an electrical parameter of a selected device against the altered reference electrical parameter, wherein at least one electrical fuse based control module is used for controlling whether the trimming device is to be coupled with the reference device based on a state of the electrical fuse, and wherein the selected electrical device is an electrical fuse.

11. A circuit for fuse reference resistance trimming, the circuit comprising:

at least one reference resistor to be trimmed having a predetermined resistance;

at least one trimming reference resistor to be coupled in a parallel fashion with the reference resistor for providing a reference resistance based on a combination of the reference resistor and the trimming reference resistor;

at least one transistor for controlling whether the trimming reference resistor is to be coupled with the reference resistor based on a state of a predetermined electrical fuse coupled thereto; and a comparison module for comparing a resistance of a selected electrical fuse against the altered reference resistance to determined a state of the selected fuse.

12. The circuit of claim 11 wherein the comparison module is a sense amplifier.

13. The circuit of claim 12 wherein the sense amplifier connects the selected electrical fuse with the reference resistor as trimmed by the at least one trimming reference resistor in a serial fashion to measure a voltage level at a node between them for providing a sensed output.

14. The circuit of claim 13 wherein the sense amplifier further comprises a control signal for enabling the sense amplifier to perform the comparison.

15. The circuit of claim 12 wherein the sense amplifier arranges the selected electrical fuse and the reference resistor as trimmed by the at least one trimming reference resistor in a parallel fashion.

16. The circuit of claim 15 wherein the sense amplifier has a first current path and a second current path coupled thereto, the first current path having a first NMOS device coupled between a first PMOS device and the reference resistor along with the trimming reference resistor, and the second current path having a second NMOS device coupled between a second PMOS device and the selected electrical fuse, wherein a drain of the first NMOS device is connected to gates of both NMOS devices and wherein the gates of the PMOS devices are controlled by a control signal.

17. The circuit of claim 16 wherein the sense amplifier further includes a first tracking resistor coupled between the first PMOS device and the first NMOS device and a second tracking resistor coupled between the second PMOS device and the second NMOS device.

18. The circuit of claim 15 wherein the sense amplifier has a first current path and a second current path coupled thereto, the first current path having a first NMOS device coupled between a first PMOS device and the reference resistor along with the trimming reference resistor, and the second current path having a second NMOS device coupled between a second PMOS device and the selected electrical fuse, wherein a drain of the first NMOS device is connected to gates of both NMOS devices and wherein the gates of the PMOS devices are connected to gates of the NMOS devices.

19. The circuit of claim 11 further comprising a data storing module for storing a state of a predetermined fuse of the fuse based control module.

* * * * *

UNITED STATES PATENT AND TRADEMARK OFFICE
CERTIFICATE OF CORRECTION

| | | |
|---|---|---|
| PATENT NO. | : 7,459,956 B2 | Page 1 of 1 |
| APPLICATION NO. | : 11/055816 | |
| DATED | : December 2, 2008 | |
| INVENTOR(S) | : Shine Chien Chung and Yun-Sheng Chen | |

It is certified that error appears in the above-identified patent and that said Letters Patent is hereby corrected as shown below:

Column 6, line 40, insert -- the -- after and.

Column 6, line 40, delete "resister" and insert -- resistor -- therefor.

Signed and Sealed this

Nineteenth Day of May, 2009

JOHN DOLL
*Acting Director of the United States Patent and Trademark Office*